United States Patent [19]

Wong

[11] Patent Number: 5,768,693

[45] Date of Patent: Jun. 16, 1998

[54] METHOD AND APPARATUS FOR CONTROLLING FREQUENCY OF A MULTI-CHANNEL TRANSMITTER

[75] Inventor: Thomas T. Y. Wong, Skokie, Ill.

[73] Assignee: Telecommunications Equipment Corporation, Palatine, Ill.

[21] Appl. No.: 396,137

[22] Filed: Feb. 28, 1995

[51] Int. Cl.$^6$ .................................................. H01Q 11/12
[52] U.S. Cl. .......................... 455/116; 455/103; 455/113
[58] Field of Search ................................ 455/116, 115, 455/119, 103, 105, 118, 102, 117, 192.1, 192.2, 310, 45, 113; 331/2

[56] References Cited

U.S. PATENT DOCUMENTS

| | | | |
|---|---|---|---|
| 3,593,182 | 7/1971 | Roelofs et al. | 331/23 |
| 3,614,640 | 10/1971 | Wolf | 327/47 |
| 3,686,574 | 8/1972 | Niman | 455/259 |
| 3,787,612 | 1/1974 | DeVries et al. | 455/259 |
| 3,867,706 | 2/1975 | Gili | 331/12 |
| 3,868,606 | 2/1975 | Driscoll | 331/175 |
| 4,041,416 | 8/1977 | Glance | 331/96 |
| 4,228,540 | 10/1980 | Ogita | 455/158.3 |
| 4,243,949 | 1/1981 | Saul et al. | 331/9 |
| 4,262,355 | 4/1981 | Schiff | 455/116 |
| 4,313,220 | 1/1982 | Lo et al. | 455/304 |
| 4,333,062 | 6/1982 | Uwano | 331/99 |
| 4,345,221 | 8/1982 | Zumsteg | 331/176 |
| 4,629,999 | 12/1986 | Hatch et al. | 331/1 R |
| 4,694,260 | 9/1987 | Argintaru et al. | 331/9 |
| 4,712,078 | 12/1987 | Slobodnik, Jr. et al. | 331/99 |
| 4,728,907 | 3/1988 | Cohen | 331/107 R |
| 4,766,398 | 8/1988 | Kiedrowski | 331/96 |
| 4,780,691 | 10/1988 | Fiedziuszko | 331/9 |
| 4,906,945 | 3/1990 | Mizuno et al. | 331/96 |
| 4,910,793 | 3/1990 | Mainardi | 455/55 |
| 5,179,725 | 1/1993 | Camp, Jr. et al. | 455/164.2 |
| 5,204,881 | 4/1993 | Cardini et al. | 455/115 |
| 5,214,787 | 5/1993 | Karkota, Jr. | 455/102 |
| 5,220,680 | 6/1993 | Lee | 455/118 |
| 5,530,920 | 6/1996 | Takeda | 455/115 |
| 5,535,247 | 7/1996 | Galius et al. | 455/118 |
| 5,551,070 | 8/1996 | Skarby et al. | 455/103 |

FOREIGN PATENT DOCUMENTS

| | | |
|---|---|---|
| 0307595 | 3/1989 | European Pat. Off. . |
| 0536835 | 4/1993 | European Pat. Off. . |

OTHER PUBLICATIONS

R.V. Pound, Electronic Frequency Stabilization of Microwave Oscillators, Review of Scientific Instruments, vol. 17, No. 11, 1946, pp. 490–505.

Primary Examiner—Reinhard J. Eisenzopf
Assistant Examiner—Marsha D. Banks-Harold
Attorney, Agent, or Firm—Speckman, Pauley & Fejer

[57] ABSTRACT

A method an apparatus for controlling frequency of a multi-channel transmitter. A reference frequency is generated and emitted to a thermally stable frequency discriminator. The thermally stable frequency discriminator emits a dc voltage to a plurality of individual oscillators. The individual oscillators in continuous wave mode or modulated by baseband signals are combined into a multi-channel signal at an intermediate range of frequencies. The multi-channel intermediate range of frequencies are preferably amplified and emitted as an output signal. At relatively lower frequencies, such as 4–6 GHz, up-conversion of the output signal is not necessary. At relatively higher frequencies, an up-converter can be used to employ a second thermally stable frequency discriminator.

19 Claims, 4 Drawing Sheets

METHOD AND APPARATUS FOR CONTROLLING FREQUENCY OF A MULTI-CHANNEL TRANSMITTER

BACKGROUND OF THE INVENTION

1. Field of the Invention

This invention relates to a method and apparatus for controlling frequency of a thermally stable microwave oscillator bank.

2. Description of Prior Art

U.S. Pat. No. 4,629,999 teaches a phase-locked loop capable of generating stable frequency signals. Voltage controlled oscillators are sequentially coupled to an output of a phase sensitive detector by a multiplexer. Oscillator outputs are sequentially coupled in synchronism with a multiplexer, to a programmable divider which is coupled to an input of the phase sensitive detector. Another input is coupled to a reference oscillator.

U.S. Pat. No. 4,694,260 discloses a microwave frequency discriminator for transforming a frequency modulated signal into a low frequency demodulated signal, wherein the discriminator is used with microwaves. An oscillating circuit has a frequency controlled by an externally applied dc voltage which is applied to a controlled circuit, such as a circuit including varactor diodes. The '260 patent discloses neither multiple microwave oscillators nor thermally coupling or frequency tracking abilities of such microwave oscillators.

U.S. Pat. No. 3,614,640 discloses a frequency discriminator which operates without inductive components. A signal is divided into two channels. One channel acts as an active filter which connects to a positive detector having an output which is transmitted to a mixing device. The other channel acts as an active filter which connects to a minus detector having an output which is also transmitted to the mixing device. Each active filter uses no inductors but has a transfer function equivalent to that of a tuned circuit.

U.S. Pat. No. 3,868,606 discloses a highly stable HF and VHF source that uses a Q-multiplied quartz crystal resonator which includes a frequency discriminator section of an AFC stabilization loop, to provide a low-noise spectrally pure frequency source.

U.S. Pat. No. 4,333,062 teaches a temperature-stabilized MIC solid-state oscillator which has two strip line resonators with chip capacitors positioned serially in the middle of the strip lines. The chip capacitors have linear capacitance temperature characteristics.

U.S. Pat. No. 4,345,221 teaches a signal generator with a digital temperature compensation circuit that has high and low frequency quartz oscillators. The low frequency oscillator is used for temperature compensation.

U.S. Pat. No. 3,787,612 discloses signal processing circuits for a telephone receiver which include acoustic surface wave devices for tuning and video demodulation. Surface wave discriminators have similar thermal characteristics and thermal exposure which cause temperature tracking of the frequency characteristics and thus temperature stabilizing of the receiver.

It is apparent from the teachings of the known prior art references that there is a need for a frequency controller that uses a plurality of electrically and thermally matched oscillators, as well as a reference oscillator and a thermally stable frequency discriminator, to produce modulated individual signals that can be combined into an intermediate frequency output signal.

SUMMARY OF THE INVENTION

One object of this invention is to provide a thermally stable microwave oscillator bank which employs one stable frequency source and which generates a reference frequency, and also employs one or more thermally stabilized frequency discriminator, depending upon whether up-conversion of the output frequency is necessary.

Another object of this invention is to provide a microwave oscillator bank which is capable of generating an array of millimeter-wave frequencies through direct modulation of the oscillators within the oscillator bank.

Still another object of this invention is to provide a microwave oscillator bank and a corresponding frequency controller that maintains temperature stability within the oscillator bank, throughout a relatively long-term useful life of the components.

The above and other objects of this invention are accomplished with a method for controlling frequency of a multi-channel transmitter in which a reference frequency is generated and emitted to a thermally stable frequency discriminator. Such thermally stable frequency discriminator emits a dc voltage to a plurality of individual oscillators. Modulation is fed through each individual oscillator to an individual signal and all modulated individual signals are then combined into a multi-channel intermediate frequency. The multi-channel intermediate frequency is preferably amplified and then emitted as an output signal. However, the multi-channel intermediate frequency can also be directly fed as an output signal.

In one preferred embodiment according to this invention, the output signal is mixed with a control signal which is emitted at a control frequency from a local oscillator. The mixed signal is then preferably but not necessarily amplified. In one preferred embodiment of this invention, the control signal is mixed with a frequency reference signal generated from a stable frequency source to form a second mixed signal. The second mixed signal is emitted to another thermally stable frequency discriminator which emits a second dc voltage to the local oscillator. The control signal can be taken from a directional coupler which is exposed to the control signal. The second mixed signal can also be amplified.

The modulated individual signals are preferably each at an intermediate frequency which is less than an output frequency of the output signal. The individual signals are preferably spaced by either one fixed frequency interval or an integer multiple of a fixed frequency interval.

Frequency control is important in many different applications of microwave and millimeter-wave systems, such as wideband multi-channel communications systems and instrumentation, which require frequency tracking among the output spectral components. In many millimeter-wave communications systems and instrumentation, oscillator banks must generate highly stable frequencies, on both long-term and short-term bases. Such oscillator banks can operate in a carrier wave (CW) mode or can be modulated with various baseband signals.

The method and apparatus of this invention provides a highly stable oscillator bank which does not require phase-locked loops, such as in systems that operate at AM, FM, FSK, PAM, PPM and the like modulation techniques. In systems that require phase-locking, such as those that operate at BPSK, QPSK and the like modulation techniques, the method and apparatus according to this invention provides effective control of the frequencies throughout elements in the oscillator bank, which thus reduces the required capture range of the phase-locked loops in the system.

Regardless of the number of individual oscillators in the oscillator bank, the method and apparatus according to this invention requires only one stable frequency reference and one or more thermally stable frequency discriminators, all of which preferably operate at a convenient intermediate frequency which is substantially lower than the millimeter-wave band of frequencies. If an oscillator bank system according to this invention operates at relatively low frequencies, such as 4–6 GHz, then exposing the output frequency to an up-conversion circuit is unnecessary and only one thermally stable frequency discriminator is necessary.

BRIEF DESCRIPTION OF THE DRAWINGS

The above-mentioned and other features of this invention will become more apparent, and the invention itself will be better understood by reference to the following description of specific embodiments of the invention taken in conjunction with the accompanying drawings, wherein.

DESCRIPTION OF PREFERRED EMBODIMENTS

Figure 1:
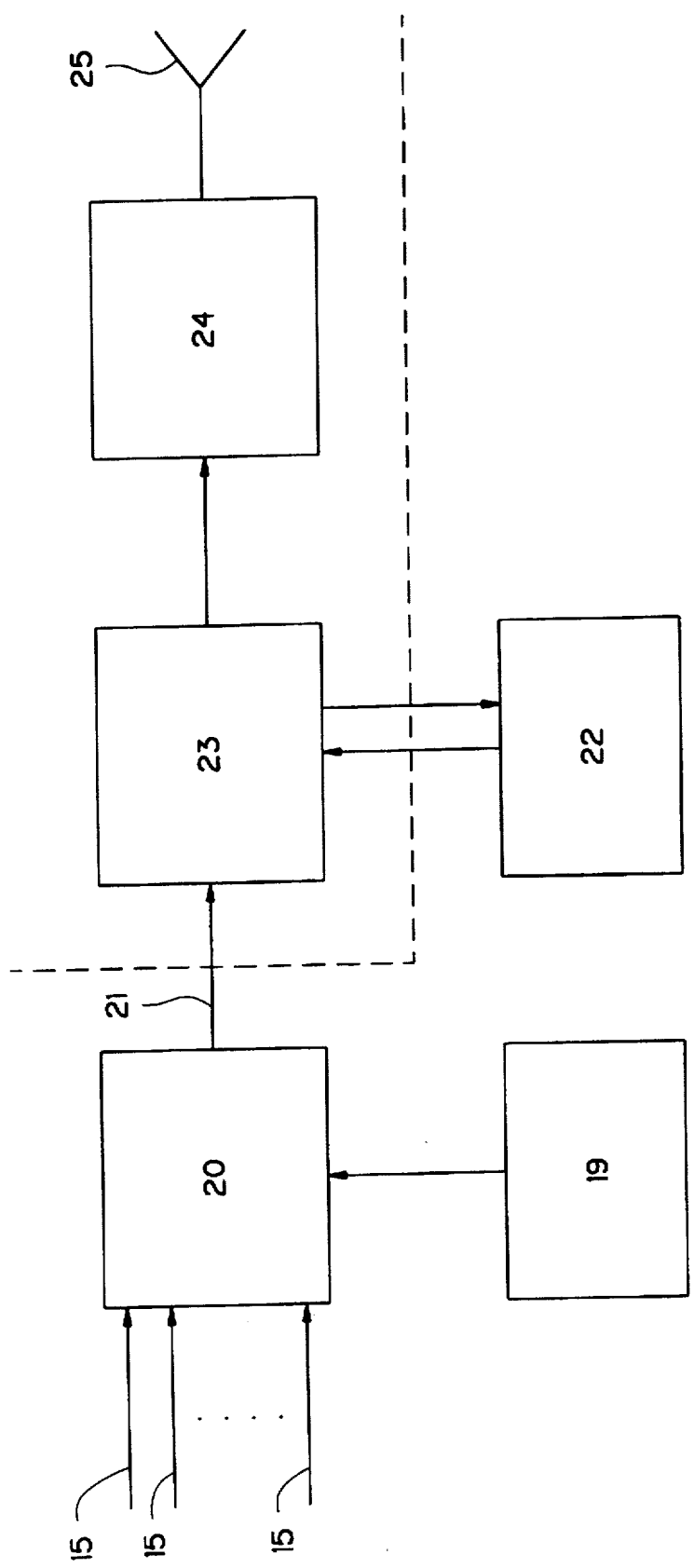
FIG. 1 is a block diagram of a multi-channel millimeter-wave transmitter, according to one preferred embodiment of this invention.

FIG. 1 shows a block diagram of a millimeter-wave transmitter, according to one preferred embodiment of this invention. Because of relatively higher losses in cables and waveguides at millimeter-wave frequencies, signals are preferably transmitted within a band of intermediate frequencies (IF) to a location near an antenna or another instrument, and are then up-converted to a millimeter-wave band for amplification and transmission.

As shown in FIG. 1, individual signals 15 are fed to modulator and combiner 20 which emits a multi-channel modulated signal 21 preferably at an IF synthesized band, such as below approximately 10 GHz. In one preferred embodiment according to this invention, a fixed frequency interval or a positive integer multiple of a fixed frequency interval is maintained between the individual modulated signals 21 emitted from modulator and combiner 20, so that no interference exists between the channels.

The multi-channel IF signal is preferably sent to a transmitter, for example by way of a cable or waveguide. Within the transmitter, up-converter and filter 23 translates modulated signal 21 to an appropriate millimeter-wave band preferably for further amplification through power amplifier 24 and transmission through antenna 25. Frequency controller 22 is preferably used to control a frequency of a local oscillator, such as local oscillator 49 shown in FIG. 2, within up-converter and filter 23. As shown in FIG. 1, frequency controller 19 is preferably used to control the frequency emitted from each individual oscillator within an oscillator bank.

When operating at an outdoor or remote location, the oscillator positioned within up-converter and filter 23 can be subjected to temperature variations. The frequency of such oscillator can be monitored and controlled in order to regulate the emitted frequency range.

Figure 2:
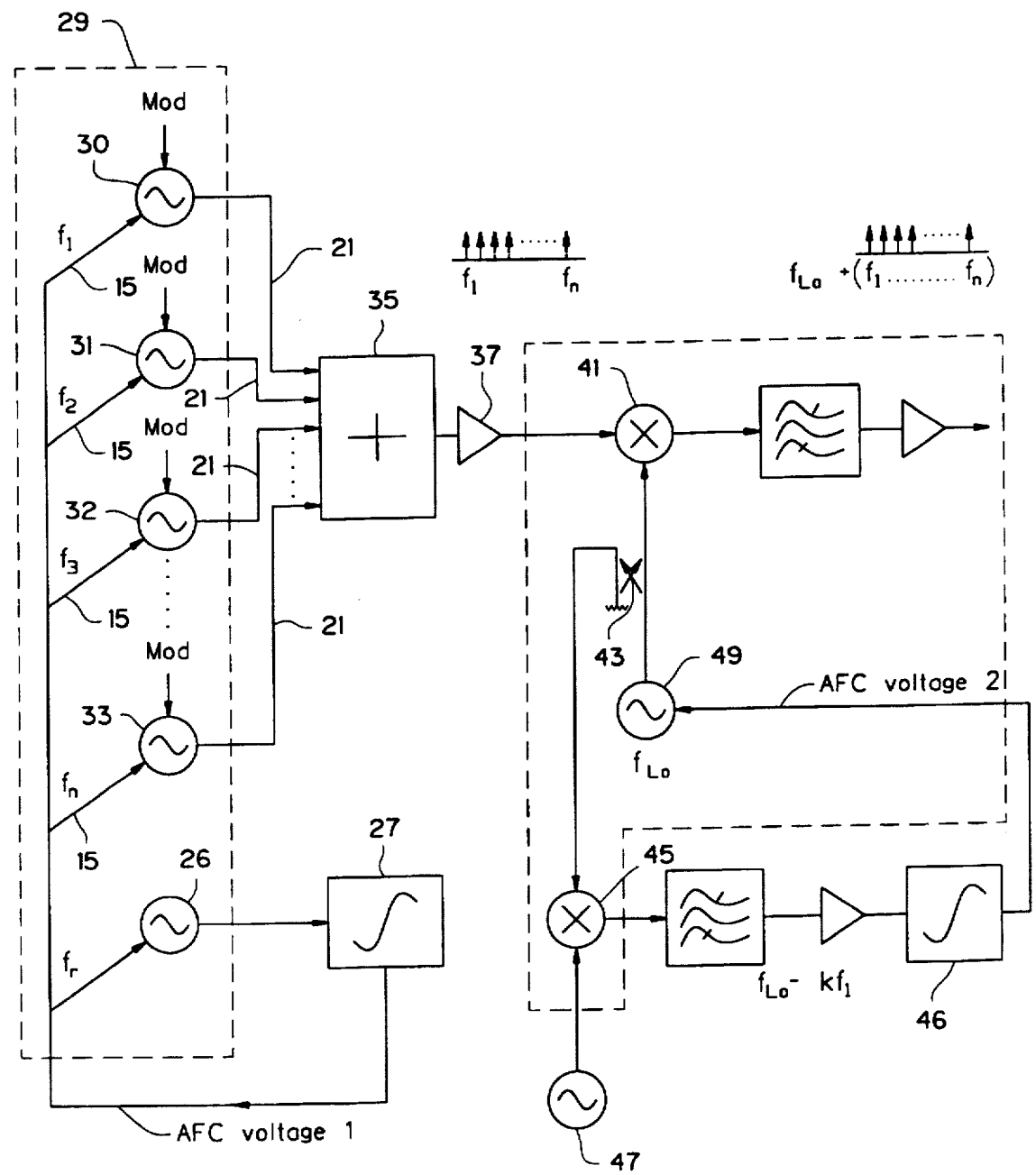
FIG. 2 is a block diagram of a multi-channel millimeter-wave transmitter, according to another preferred embodiment of this invention.

Referring to FIG. 2, an oscillator bank according to one preferred embodiment of this invention comprises oscillators 30–33. It is apparent that any number of a plurality of oscillators 30–33 can be employed, according to this invention. Oscillator 33 is intended to represent the nth oscillator within oscillator bank 29. According to one preferred embodiment of this invention, individual oscillators 30–33 which operate at the IF band are thermally coupled with respect to each other. Such thermal coupling can be accomplished, for example, by positioning all individual oscillators 30–33 in an enclosed cabinet. Such enclosed cabinets are often used in an indoor environment and are well known by those skilled in the art of constructing enclosures for oscillator banks.

As shown in FIG. 2, reference oscillator 26 generates a reference frequency $f_r$ which is emitted to thermally stable frequency discriminator 27. Reference oscillator 26 is preferably positioned within the same environment, such as the physical cabinet enclosure, as individual oscillators 30–33. Also, reference oscillator 26 is preferably an electrical equivalent to any one of individual oscillators 30–33. In preferred embodiments according to this invention, reference oscillator 26 does not contribute to the IF signal. Reference oscillator 26 and oscillators 30–33 are preferably constructed with identical circuit design, layout and physical housings. Such similarity between reference oscillator 26 and each of oscillators 30–33 result in all of the oscillators being electrically equivalent with respect to each other. Such electrical equivalence can be accomplished by matching the thermoelectric properties of the related semiconductor devices, such as in a manner known to those skilled in the art of constructing semiconductor devices. For example, the thermoelectric properties of reference oscillator 26 and oscillators 30–33 can be matched through well known measurement techniques apparent to those skilled in the art.

Any undesired offset in frequency between individual oscillators 30–33 can be adjusted by mechanical tuning. For example, in a dielectric resonator oscillator, mechanical tuning can be accomplished by adjusting a metal plate above the dielectric resonator. Temperature coefficients of the resonant frequencies of oscillators with identical design are very close to each other. For oscillators operating within an indoor environment, such as at temperatures between approximately 15° C. and 30° C., temperature compensation can be used to minimize any frequency drift. Frequency drift is detected at the output of reference oscillator 26. The frequency $f_r$ of reference oscillator 26 is preferably chosen so that as shown in FIG. 2, $f_1 < f_r < f_n$.

Any change in output frequency causes a dc output voltage from frequency discriminator 27. Such dc output voltage can be fed to individual oscillators 30–33 to cancel the shift in frequency between such oscillators 30–33. Because oscillators 30–33 are preferably temperature matched with respect to each other, the same dc output voltage can be used to correct the frequency drift between oscillators 30–33.

If relatively small deviations exist between the temperature coefficients associated with oscillators 30–33, simple resistive networks can be used to alleviate such relatively small deviations, by distributing the automatic frequency control (AFC) voltage sent to individual oscillators 30–33. By calibrating the resistive network at a hot end and at a cold end of a temperature range, proper tracking will exist throughout the intended operating temperature range.

If the method and apparatus according to this invention are practiced in an outdoor environment, it is likely that considerable variation in output frequency, commonly referred to as free-running, will occur. Other components with an up-converter in filter 23 can be used to change the frequency of the output signal. As shown in FIG. 2, local oscillator 49 can be used to emit a signal to mixer 41 for mixing with the modulated signal 21 from modulator and combiner 20. As shown in FIG. 2, directional coupler 43 takes a sample signal from the output of local oscillator 49 and mixes the sample signal with an output signal from stable oscillator 47, which is preferably located in an indoor environment. The frequency of stable oscillator 47 is preferably chosen at an IF band so that the frequency signal can be sent to up-converter and filter 23 without significant losses. If the distance between up-converter and filter 23 and stable oscillator 47 is relatively large, it is apparent that the signal strength at stable oscillator 47 can be increased prior to mixing at mixer 45. An appropriate component of the mixed signal emitted from mixer 45 can be chosen to represent the frequency condition of stable oscillator 47. Such frequency component, shown in FIG. 2 as $f_{LO}-kf_r$, where k is an integer, will reflect any shift in $f_{LO}$. Thermally stable frequency discriminator 46 preferably generates a dc correction voltage which is proportional to the frequency drift in $f_{LO}$, and sends such dc correction voltage as an input to local oscillator 49.

Thus, according to the method and apparatus of this invention, it is necessary to employ only one stable frequency source, stable oscillator 47, at a convenient IF frequency, and one or more thermally stable frequency discriminators, 27 or 46. Such components are preferably located in an indoor environment and thus can be easily temperature regulated.

Figure 4:
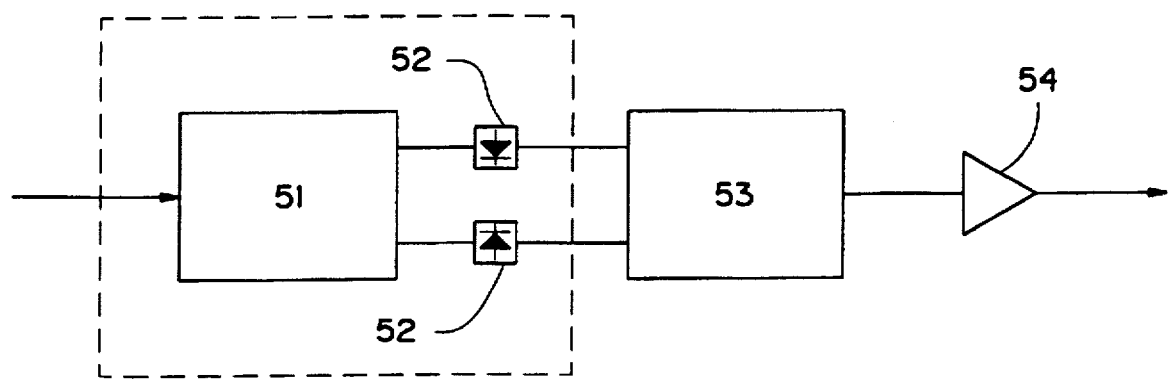
FIG. 4 is a block diagram of a frequency discriminator, according to one preferred embodiment of this invention.

FIG. 4 shows a block diagram for a frequency discriminator, such as frequency discriminator 27 or 46, according to one preferred embodiment of this invention. As shown in FIG. 4, only filter or dispersive network 51 and detector diodes 52 are thermally stabilized. The remaining components, such as low-pass filter 53 and dc amplifier 54, can be thermally unregulated.

Figure 3:
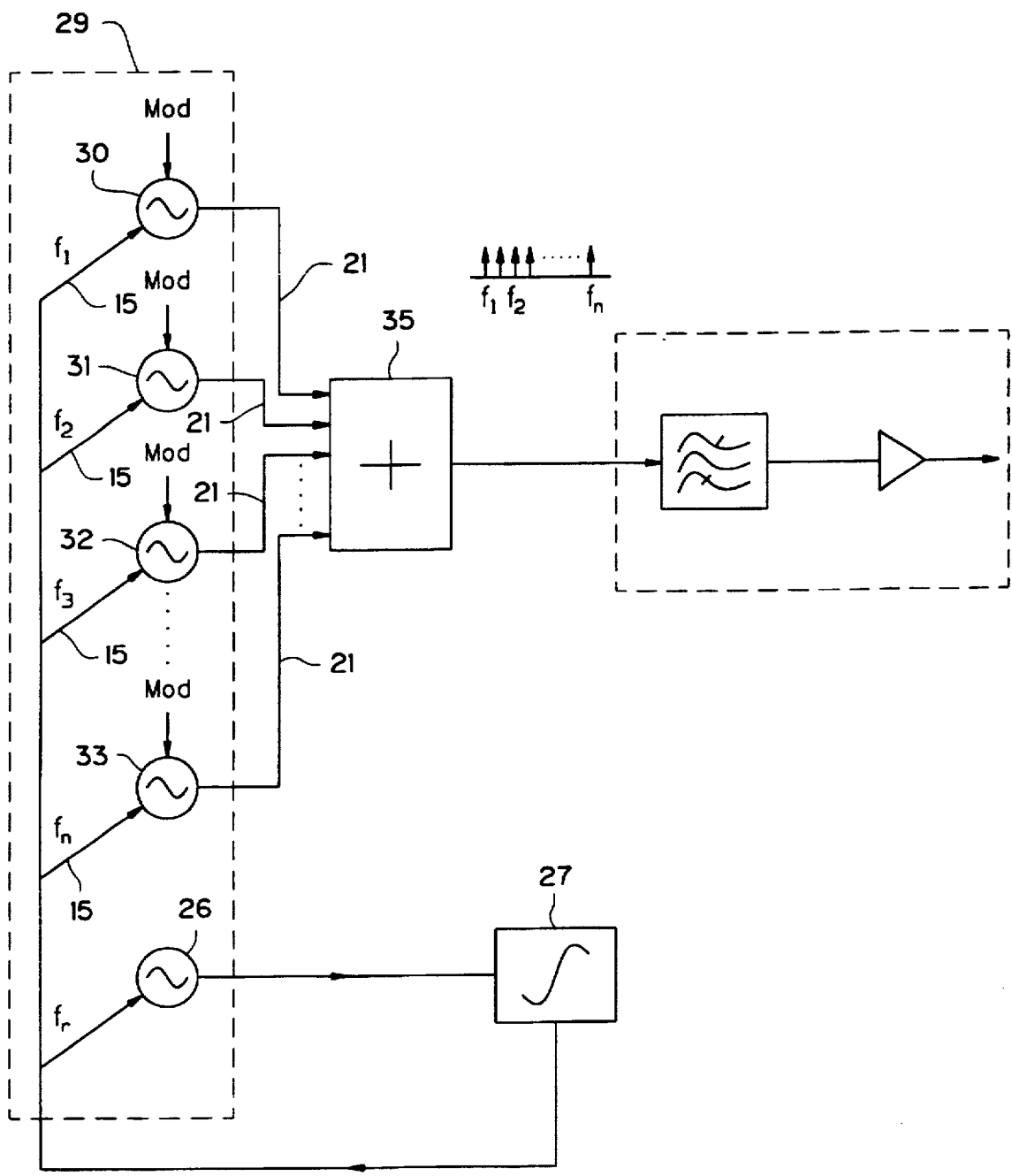
FIG. 3 is a block diagram of a multi-channel microwave transmitter, according to still another preferred embodiment of this invention.

FIG. 3 shows another preferred embodiment according to this invention of an apparatus for controlling frequency of a multi-channel microwave transmitter. In such preferred embodiment, oscillator bank 29 operates in a relatively lower frequency range where losses due to cables and waveguides are relatively low. FIG. 3 shows a direct synthesis system which is capable of generating an array of microwave channels up to approximately 20 GHz. The system shown in FIG. 3 requires no up-conversion function and requires only one thermally stable frequency discriminator 27.

In phase-coherent communications systems or certain instrumentation, oscillators should be phase-locked. The method and apparatus according to this invention can provide an effective means for preventing oscillators 30–33 from drifting out of a capture range of the phase-locked loops, as a result of temperature change and aging of the components. Each oscillator 30–33 can be controlled by both the frequency control voltages emitted from frequency discriminator 27, as well as by controlling an amplified mixer output of a phase-locked loop, which may derive a reference signal from a designated reference. Such phase control signal should have a much faster response time than the AFC signal emitted from frequency discriminator 27, so that the short-term stability of reference oscillator 26 as well as its phase can be easily regulated. In one preferred embodiment according to this invention, the means for generating and emitting the referenced frequency to thermally stable frequency discriminator 27 comprises frequency oscillator 26 having an output electrically coupled to an input of frequency discriminator 27. It is apparent that such local oscillator can be any suitable oscillator or oscillating device known to those skilled in the art. Likewise, individual oscillators 30–33 of oscillator bank 29 can be combined to receive the output signal from frequency discriminator 27, in any suitable hardware manner known to those skilled in the art. Summing device 35, mixers 41 and 45, and amplifiers 24, 37 and 54 can also be of any conventional hardware components known to those skilled in the art.

While in the foregoing specification this invention has been described in relation to certain preferred embodiments thereof, and many details have been set forth for purpose of illustration, it will be apparent to those skilled in the art that the invention is susceptible to additional embodiments and that certain of the details described herein can be varied considerably without departing from the basic principles of the invention.

What is claimed is:

1. A method for controlling frequency of a multi-channel transmitter, including the steps of:

generating a reference frequency and emitting the reference frequency to a first thermally stable frequency discriminator;

emitting a first dc voltage from the first thermally stable frequency discriminator simultaneously to a plurality of individual oscillators; and combining a plurality of individual signals correspondingly emitted from the individual oscillators into an output signal having a multi-channel intermediate frequency.

2. In a method according to claim 1 wherein the multi-channel intermediate frequency is amplified and emitted as the output signal.

3. In a method according to claim 1 wherein the output signal is mixed with a control signal emitted at a control frequency from a local oscillator to form a first mixed signal and the first mixed signal is amplified.

4. In a method according to claim 1 wherein the individual signals are each at an intermediate frequency less than an output frequency of the output signal.

5. In a method according to claim 1 wherein the individual signals are different from each other and at least one fixed frequency interval is between adjacent said individual signals.

6. In a method according to claim 1 wherein the individual signals are amplified before the individual signals are modulated and combined.

7. A method for controlling frequency of a multi-channel transmitter, including the steps of:

generating a reference frequency and emitting the reference frequency to a first thermally stable frequency discriminator;

emitting a first dc voltage from the first thermally stable frequency discriminator to a plurality of individual oscillators;

combining a plurality of individual signals correspondingly emitted from the individual oscillators into an output signal having a multi-channel intermediate frequency; and mixing the output signal with a control signal emitted at a control frequency from a local oscillator to form a first mixed signal and amplifying the first mixed signal, and mixing a sample of the control signal with a frequency reference signal generated from a stable frequency source to form a second mixed signal, emitting the second mixed signal to a second thermally stable frequency discriminator, and emitting a second dc voltage from the second thermally stable frequency discriminator which is received by the local oscillator.

8. In a method according to claim 7 wherein the sample of the control signal is taken from a directional coupler exposed to the control signal.

9. In a method according to claim 7 wherein the second mixed signal is amplified.

10. A frequency controller for a multi-channel transmitter, the frequency controller comprising:

a first thermally stable frequency discriminator, first means for generating and emitting a reference frequency to said first thermally stable frequency discriminator; and a plurality of individual oscillators combined to simultaneously receive a discriminator output signal emitted from said first thermally stable frequency discriminator, second means for combining a plurality of individual signals emitted from said oscillators into an output signal having a multi-channel intermediate frequency.

11. A frequency controller according to claim 10 further comprising third means for amplifying the multi-channel intermediate frequency to form the output signal.

12. A frequency controller according to claim 10 further comprising: a local oscillator emitting a control signal at a control frequency, and fourth means for mixing said control signal with said output signal and emitting a first mixed signal.

13. A frequency controller according to claim 12 further comprising fifth means for amplifying said first mixed signal.

14. A frequency controller according to claim 10 wherein said individual signals are each at an intermediate frequency less than an output frequency of said output signal.

15. A frequency controller according to claim 10 wherein said individual signals are different from each other and at least one fixed frequency interval is between adjacent said individual signals.

16. A frequency controller according to claim 10 wherein said individual signals are amplified before said individual signals are combined.

17. A frequency controller for a multi-channel transmitter, the frequency controller comprising:

a first thermally stable frequency discriminator, first means for generating and emitting a reference frequency to said first thermally stable frequency discriminator;

a plurality of individual oscillators combined to receive a discriminator output signal emitted from said first thermally stable frequency discriminator, second means for combining a plurality of individual signals emitted from said oscillators into an output signal having a multi-channel intermediate frequency; and a local oscillator emitting a control signal at a control frequency, fourth means for mixing said control signal with said output signal and emitting a first mixed signal, a second thermally stable frequency discriminator, a stable frequency source generating a frequency reference signal, fifth means for mixing said control signal with said frequency reference signal to form a second mixed signal and to emit said second signal to said second thermally stable frequency discriminator, and said local oscillator receiving a second voltage emitted from said second thermally stable frequency discriminator.

18. A frequency controller according to claim 17 further comprising a directional coupler exposed to said control signal.

19. A frequency controller according to claim 17 further comprising sixth means for amplifying said second mixed signal.

* * * * *